United States Patent
Hughes et al.

(10) Patent No.: US 12,295,132 B1
(45) Date of Patent: May 6, 2025

(54) MAGNETIC SHIELDING FOR ION PUMPS

(71) Applicant: ColdQuanta, Inc., Boulder, CO (US)

(72) Inventors: Steven Michael Hughes, Louisville, CO (US); Evan Salim, Lafayette, CO (US); Hugo Leon, Longmont, CO (US); Christopher Robert Sheridan, III, Boulder, CO (US); Stetson Joe Roof, Longmont, CO (US)

(73) Assignee: ColdQuanta, Inc., Boulder, CO (US)

( * ) Notice: Subject to any disclaimer, the term of this patent is extended or adjusted under 35 U.S.C. 154(b) by 244 days.

(21) Appl. No.: 18/137,983

(22) Filed: Apr. 21, 2023

Related U.S. Application Data (60) Provisional application No. 63/333,621, filed on Apr. 22, 2022.

(51) Int. Cl.
*H05K 9/00* (2006.01)
*H01J 5/02* (2006.01)

(52) U.S. Cl.
CPC ............... *H05K 9/0075* (2013.01); *H01J 5/02* (2013.01)

(58) Field of Classification Search
CPC .................................. H05K 9/0075; H01J 5/02
See application file for complete search history.

(56) References Cited

U.S. PATENT DOCUMENTS

| | | | | |
|---|---|---|---|---|
| 7,511,425 B2* | 3/2009 | Tsuda | ............ | H01J 31/123 |
| | | | | 313/313 |
| 2006/0043866 A1* | 3/2006 | Tsuda | ............ | H01J 29/867 |
| | | | | 313/365 |
| 2023/0169385 A1* | 6/2023 | Meinert | ............ | G06N 10/40 |
| | | | | 250/251 |

FOREIGN PATENT DOCUMENTS

| | | | | |
|---|---|---|---|---|
| CN | 106772652 A | * | 5/2017 | ............ G01V 7/00 |
| CN | 110174833 A | * | 8/2019 | ............ G04F 5/14 |
| KR | 20170070509 A | * | 6/2017 | ............ H01J 37/18 |

\* cited by examiner

*Primary Examiner* — Abdullah A Riyami
*Assistant Examiner* — Syed M Kaiser
(74) *Attorney, Agent, or Firm* — Young Basile Hanlon & MacFarlane, P.C.

(57) ABSTRACT

A system including a vacuum cell, an ion pump, and a multi-layer magnetic shield is described. The vacuum cell includes a magnetic field-sensitive section, a pump section, and a channel section providing a vacuum conductance path between the magnetic field-sensitive section and the pump section. The ion pump is in the pump section. The multi-layer magnetic shield surrounds at least a portion of the ion pump. The multi-layer magnetic shield has a first layer and a second layer. The first layer is between the second layer and the ion pump. The first layer has a moderate relative magnetic permeability and a high saturation magnetization. The second layer has a high relative magnetic permeability and a moderate saturation magnetization.

14 Claims, 6 Drawing Sheets

MAGNETIC SHIELDING FOR ION PUMPS

CROSS REFERENCE TO OTHER APPLICATIONS

This application claims priority to U.S. Provisional Patent Application No. 63/333,621 entitled MAGNETIC SHIELDING FOR ION PUMP filed Apr. 22, 2022 which is incorporated herein by reference for all purposes.

BACKGROUND OF THE INVENTION

Vacuum cells used in a number of applications are capable of achieving a high vacuum (HV), an ultra-high vacuum (UHV) (e.g. pressures of $10^{-9}$ Torr or less), or an extreme high vacuum (XHV) (e.g. pressures on the order of $10^{-13}$ Torr or less). For example, such vacuum cells may be used in cold atom and/or ion technologies, in which quantum particles (e.g. atoms, molecules, and/or ions) are provided and maintained (or trapped) in the inner chamber, frequently at temperatures well under 1 K. Particles in such vacuum cells may be used in quantum computing, basic research, sensors, as well as other technologies.

In order to achieve HV, UHV, or XHV, ion pumps are frequently used. Ion pumps typically generate magnetic fields on the order of 0.1 T (1,000 G). For bench top systems, portions of the vacuum cells in which the quantum particles are trapped or which are otherwise sensitive to magnetic fields are widely spaced from the magnetic fields of the ion pump. For example, these magnetic field-sensitive sections of the vacuum cell may be six inches or more from the ion pump. Consequently, simple magnetic shielding may be used for the ion pump. However, deployable systems utilizing quantum particles are desired to be compact, power efficient, and ruggedized for harsh environments. The size, weight, and power (SWaP) benchmarks are desired to be reduced. In such compact systems, current shielding may be inadequate. Use of an ion pump thus adversely affects performance of the system. Accordingly, what is desired is an improved technique for addressing magnetic fields for a compact system.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system including a vacuum cell, an ion pump, and a multi-layer magnetic shield is described. The vacuum cell includes a magnetic field-sensitive section, a pump section, and a channel section providing a vacuum conductance path between the magnetic field-sensitive section and the pump section. The ion pump is in the pump section. The multi-layer magnetic shield surrounds at least a portion of the ion pump. The multi-layer magnetic shield has a first layer and a second layer. The first layer is between the second layer and the ion pump. The first layer has a moderate relative magnetic permeability and a high saturation magnetization. The second layer has a high relative magnetic permeability and a moderate saturation magnetization. For example, the first layer may include or consist of Kovar, while the second layer may include or consist of MuMetal. In some embodiments, the channel section of the vacuum cell is configured such that an aperture-free portion of the multi-layer magnetic shield is between the ion pump and the magnetic field-sensitive section of the vacuum cell. For example, the channel section may be curved.

Figure 1:
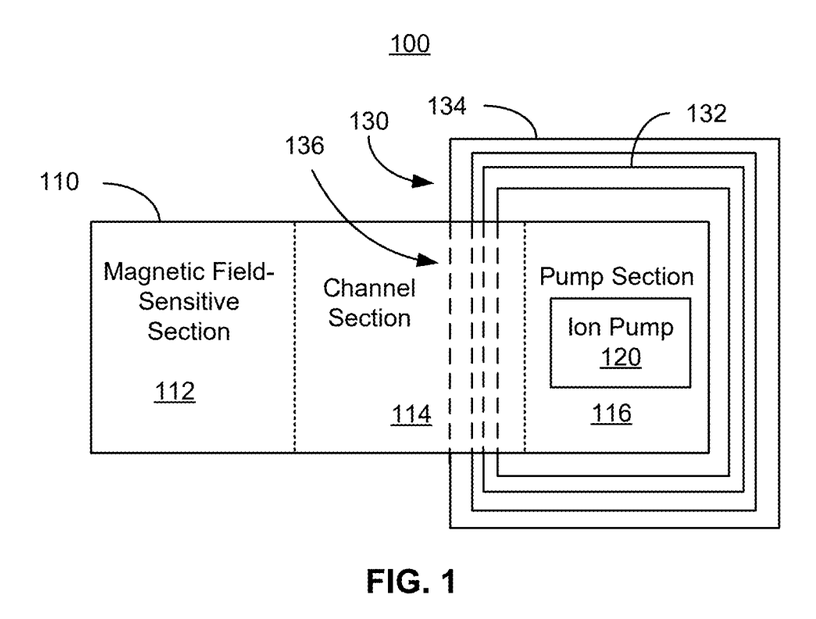
FIG. 1 is a block diagram depicting an embodiment of a system including an ion pump and vacuum cell that is usable in connection with quantum particles.

FIG. 1 is a block diagram depicting an embodiment of system 100 usable in connection with quantum particles. System 100 includes vacuum cell 110, ion pump 120, and multi-layer magnetic shield 130. Other and/or additional components of system 100 may be present but are not shown for clarity. For example, other equipment within vacuum cell 110, associated electronics for controlling ion pump 120, and/or electronics for controlling operation of equipment in vacuum cell 110 are not shown. Further, because system 100 is shown as a block diagram, size, shape, locations, and/or orientations of components of system 100 may differ than depicted in FIG. 1.

System 100 is compact. For example, in some embodiments, the largest dimension of system 100 (e.g. the length of vacuum cell 110) may not exceed twelve inches. In some embodiments, the largest dimension may not exceed six inches. In some embodiments, the largest dimension may not exceed three inches. Further, components are in close proximity. For example, if multi-layer shield has a characteristic width (e.g. a diameter) substantially in the plane of vacuum cell 110, magnetic field-sensitive section 112 may be not more than three multiplied by the characteristic width from ion pump 120. In some embodiments, magnetic field-sensitive section 112 is not more than two multiplied by the characteristic width from ion pump 120. In some such embodiments, magnetic field-sensitive section 112 is not more than the characteristic width from ion pump 120. For example, magnetic field-sensitive section 112 may be not more than two inches from ion pump 120. In some cases, magnetic field-sensitive section 112 is not more than one inch from ion pump 120.

Vacuum cell 110 includes magnetic field-sensitive section 112, channel section 114, and pump section 116. Ion pump 120 resides in pump section 116. Channel section 114 provides a vacuum conduction path between ion pump 120 and magnetic field-sensitive section 112. Magnetic field-sensitive section 112 may be utilized to house and/or perform operations with quantum particles. For example, magneto-optical traps (MOTs) and/or other mechanisms for trapping and/or manipulated quantum particles may be included in magnetic field-sensitive section 112.

Along with other vacuum pumps, ion pump 120 may be used to evacuate magnetic field-sensitive section 112. Ion pump 120 utilizes a high magnetic field (e.g. on the order of 1 T) in order to perform this function. Thus, although not depicted in FIG. 1, ion pump 120 typically includes permanent magnets, such as neodymium or SmCo magnets, that provide a large magnetic field in the interior of ion pump 120.

Multi-layer magnetic shield 130 is utilized to contain the magnetic field of ion pump 120. Thus, magnetic leakage from multi-layer magnetic shield 130 is small or negligible (or nonexistent) in magnetic field-sensitive section 112. More specifically, multi-layer magnetic shield 130 allows for the presence of a large magnetic field in ion pump 120 and prevents in magnetic field-sensitive region 112 a magnetic field due to ion pump 120 that would adversely affect performance of system 100. Multi-layer magnetic shield 130 includes first layer 132 and second layer 134. In some embodiments, multi-layer magnetic shield 130 (and thus layers 132 and 134) include an aperture 136 therein. Thus, ion pump 120 and pump section 116 are physically within multi-layer magnetic shield 130, while magnetic field-sensitive section 112 is external to multi-layer magnetic shield 130.

First layer 132 has a moderate relative magnetic permeability and a high saturation magnetization. Thus, the response (change in magnetization) of first layer 132 due to an applied field (e.g. from the magnets in ion pump 120) is moderate. However, because the saturation magnetization is high, a large field may be shielded by first layer 132. The relative magnetic permeability typically depends on the frequency of the applied magnetic field. For higher frequency applied magnetic fields, the relative magnetic permeability generally decreases. In some embodiments, first layer 132 has a maximum relative magnetic permeability that is at least one thousand and not more than twenty thousand. In some such embodiments, first layer 132 has a maximum relative magnetic permeability that is at least two thousand and not more than four thousand. In some embodiments, the high saturation magnetization is a least ten thousand Gauss. For example, first layer 132 may include or consist of Kovar (maximum relative magnetic permeability: 3000 and saturation magnetization: 12,000 Gauss).

Second layer 134 has a high relative magnetic permeability and a moderate saturation magnetization. For example, second layer 134 may have a maximum relative magnetic permeability of at least seventy thousand. The moderate saturation magnetization may be at least four thousand Gauss and not more than nine thousand Gauss. In some such embodiments, the maximum relative magnetic permeability is at least ninety thousand. In some such embodiments, the moderate saturation magnetization is at least six thousand Gauss and not more than eight thousand five hundred Gauss. Second layer 134 is thus more responsive to an applied magnetic field than first layer 134, but may saturate at lower applied magnetic fields. For example, second layer 134 may include or consist of MuMetal (maximum relative magnetic permeability: 100,000 and saturation magnetization: 7,500 Gaus).

The combination of first layer 132 and second layer 134 allow multi-layer magnetic shield 130 to substantially contain the large magnetic field from ion pump 120. In particular, first layer 132 significantly decreases the magnitude of the magnetic field outside of first layer 132. As a result, the higher relative magnetic permeability (but lower saturation magnetization) second layer 134 may be utilized to complete shielding of ion pump 120.

System 100 may be made more compact without adversely affecting performance. Ion pump 120 may be used to evacuate vacuum cell 110. As a result, HV, UHV, and/or XHV pressures may be achieved in vacuum cell 110. Ion pump 120 employs a high magnetic field and is in close physical proximity to magnetic field-sensitive section 112. However, use of multi-layer magnetic shield 130 may sufficiently shield magnetic-field sensitive section 112 such that operation of components therein is not adversely affected. For example, one or more MOTs (not shown in FIG. 1) may be utilized to trap quantum particles. Consequently, system 100 is compact, capable of reaching sufficiently high vacuums, and highly effective for use in conjunction with quantum particles.

Figure 2A:
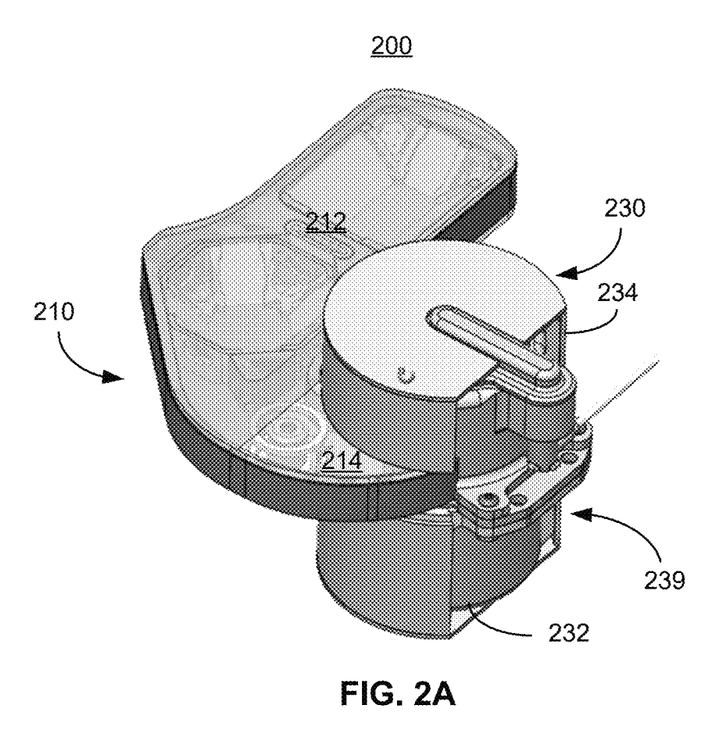
FIGS. 2A-2E are diagrams depicting an embodiment of a system including an ion pump and vacuum cell that is usable in connection with quantum particles.
Figure 2B:
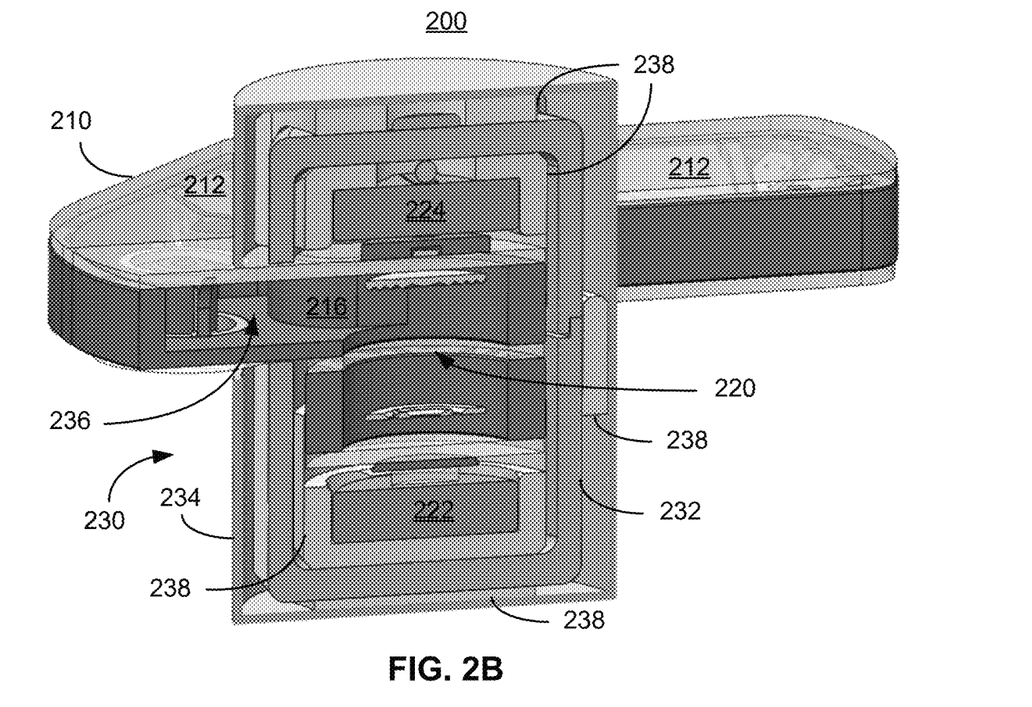
Figure 2C:
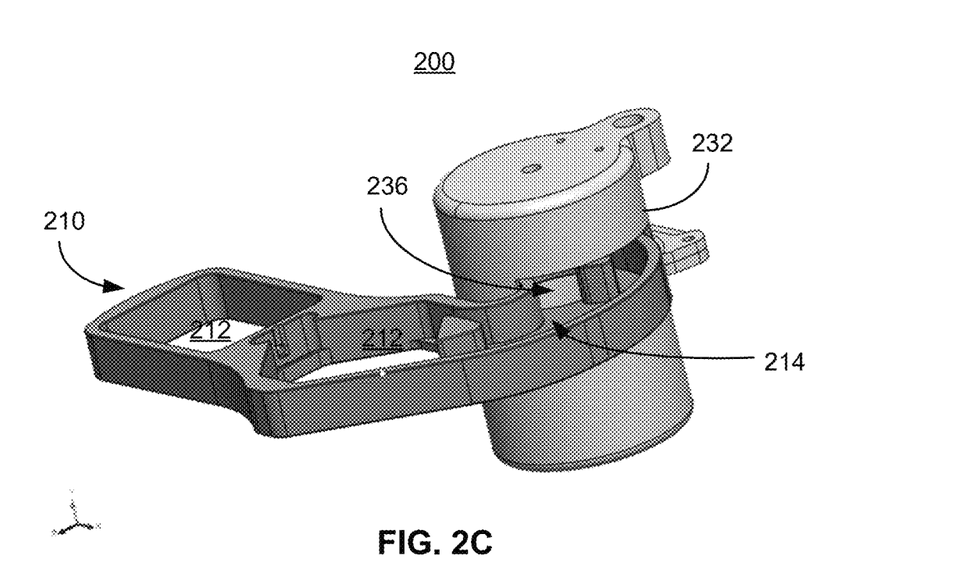
Figure 2D:
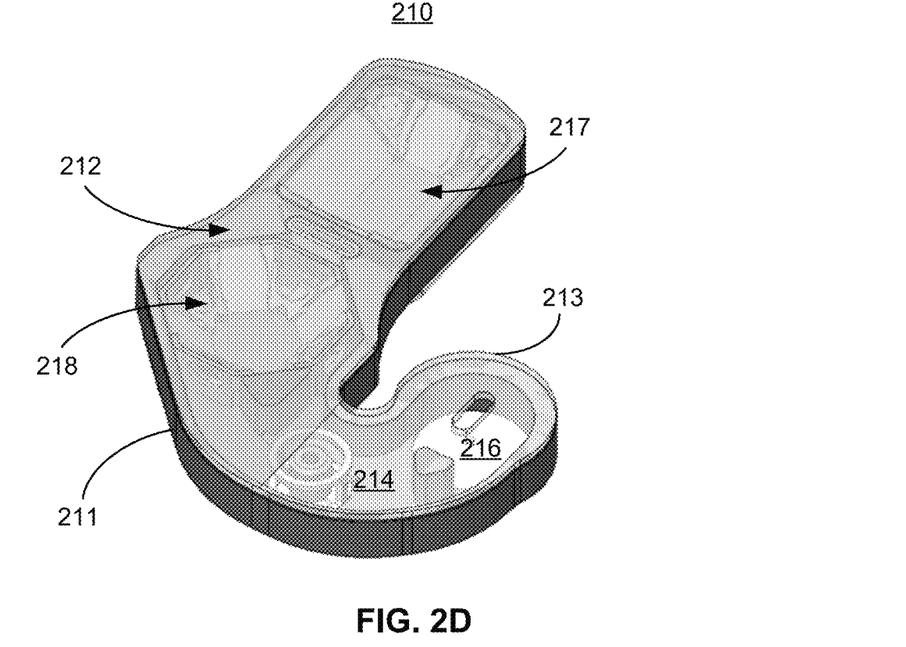
Figure 2E:
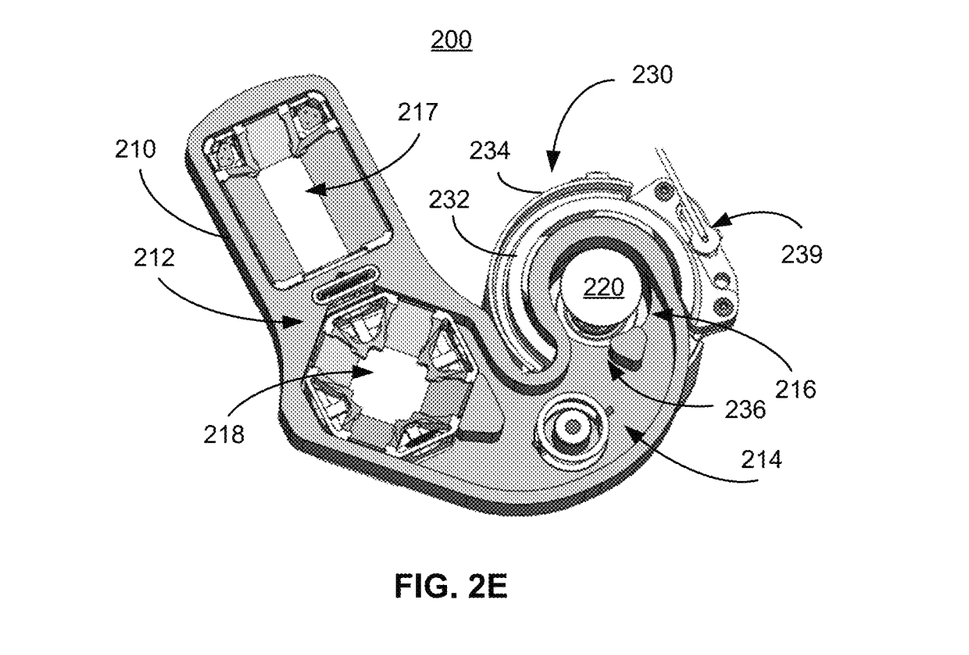

FIGS. 2A-2E are diagrams depicting various views of an embodiment of system 200 that is usable in conjunction with quantum particles. FIG. 2A depicts a perspective view of system 200. FIG. 2B depicts a cross-sectional view of a portion of system 200. FIG. 2C depicts a perspective view of a portion of system 200. FIG. 2D is a top view of vacuum cell 210 of system 200. FIG. 2E is a top cross-sectional view of system 200. Referring to FIGS. 2A-2E, system 200 includes vacuum cell 210, ion pump 220, and multi-layer magnetic shield 230 that are analogous to vacuum cell 110, ion pump 120, and multi-layer magnetic shield 130, respectively, of system 100. Other and/or additional components of system 200 may be present but are not shown for clarity. System 200 is also compact. Thus, system 200 has dimensions analogous to those discussed with respect to system 100.

Vacuum cell 210 includes magnetic field-sensitive section 212, channel section 214, and pump section 216 that are analogous to magnetic field-sensitive section 112, channel section 114, and pump section 116. Sections 212, 214 and 216 are formed in cell body 211. The interior of vacuum cell 210 is enclosed by cell body 211 and cover 213. In the embodiment shown, optical access to the interior of vacuum cell 210 is provided via cover 213. Vacuum cell 210 also includes three-dimensional MOT 218 and two-dimensional MOT 217 for use with quantum particles. MOTs 217 and 218 are within magnetic field-sensitive section 212. Channel section 214 provides a vacuum conduction path between ion pump 220 and magnetic field-sensitive section 212. Further, channel section 214 has been distorted in comparison to the block diagram of FIG. 1. As can be seen in FIGS. 2D and 2E, channel section 214 is curved such that aperture 236 is not facing or aligned with magnetic field-sensitive section 214. More specifically, a portion of multi-layer magnetic shield 230 that is free of apertures is between aperture 236 (and aperture 239, described below) and magnetic field-sensitive section 214. Thus, multi-layer magnetic shield 230 may sufficiently shield MOTs 217 and 218 from the magnetic field of ion pump 220.

Ion pump 220 is analogous to ion pump 120. Thus, ion pump 220 is in pump section 216. Ion pump 220 utilizes a high magnetic field (e.g. on the order of 1 T). Consequently, ion pump 220 includes permanent magnets 222 and 224 that provide a large axial magnetic field in the interior of ion pump 220. In some embodiments, permanent magnets 222 and 224 are neodymium magnets. In other embodiments, other source(s) of high magnetic field(s) may be used.

Multi-layer magnetic shield 230 is analogous to multi-layer magnetic shield 130. Multi-layer magnetic shield 230 substantially contains the magnetic field of ion pump 220. Thus, magnetic leakage from multi-layer magnetic shield 230 is small or negligible (or nonexistent) in magnetic field-sensitive region 212. Multi-layer magnetic shield 230 includes first layer 232 and second layer 234 that are analogous to layers 132 and 134 of system 100. Multi-layer magnetic shield 230 (and thus layers 232 and 234) include aperture 236 that is analogous to aperture 136. Ion pump 220 and pump section 216 are physically within multi-layer magnetic shield 230, while magnetic field-sensitive section 212 is external to multi-layer magnetic shield 230. As indicated in FIG. 2A, second layer 234 may also include an additional aperture 239 distal from magnetic field-sensitive section 212. Also shown in FIG. 2B are nonmagnetic spacers 238 of multi-layer magnetic shield 230. Some spacers 238 separate first and second layers 232 and 234. Some spacers 238 also separate first layer 232 from permanent magnets 224 of ion pump 220.

First layer 232 has a moderate relative magnetic permeability and a high saturation magnetization, for example in the ranges described in the context of first layer 132. In some embodiments, first layer 232 includes or consists of Kovar. Second layer 234 has a high relative magnetic permeability and a moderate saturation magnetization, for example in the ranges described in the context of second layer 134. In some embodiments, second layer 234 may include or consist of MuMetal. First layer 232 and second layer 234 combine to allow multi-layer magnetic shield 230 to substantially contain the large magnetic field from ion pump 220. In particular, first layer 232 significantly decreases the magnitude of the magnetic field outside of first layer 232. As a result, the higher relative magnetic permeability (but lower saturation magnetization) second layer 234 may be utilized to complete shielding of ion pump 220.

System 200 shares the benefits of system 100. System 200 may be made more compact without adversely affecting performance. Ion pump 220 may be used to evacuate vacuum cell 210. As a result, HV, UHV, and/or XHV pressures may be achieved in vacuum cell 210. The high magnetic field of ion pump 220 is in close physical proximity to magnetic field-sensitive section 212. However, multi-layer magnetic shield 230 sufficiently shields magnetic-field sensitive section 212 that operation of components such as MOTs 217 and 218 is not adversely affected. Consequently, system 200 is compact, capable of reaching sufficiently high vacuums, and highly effective for use in conjunction with quantum particles.

Figure 3:
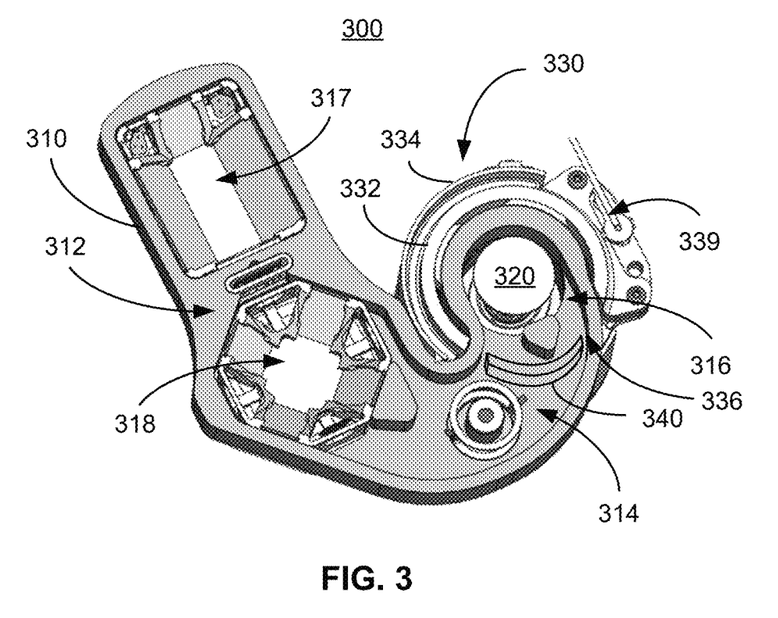
FIG. 3 is a diagram depicting an embodiment of a system including an ion pump and vacuum cell that is usable in connection with quantum particles.

FIG. 3 is a diagram depicting a top cross-sectional view of an embodiment of system 300 usable in connection with quantum particles. System 300 includes vacuum cell 310, ion pump 320, and multi-layer magnetic shield 330 that are analogous to vacuum cell 210, ion pump 220, and multi-layer magnetic shield 230, respectively, of system 200. Other and/or additional components of system 300 may be present but are not shown for clarity. System 300 is also compact. Thus, system 300 has dimensions analogous to those discussed with respect to system 100.

Vacuum cell 310 includes magnetic field-sensitive section 312, channel section 314, and pump section 316 that are analogous to magnetic field-sensitive section 212, channel section 214, and pump section 216. Vacuum cell 310 also includes three-dimensional MOT 318 and two-dimensional MOT 317 that are analogous to MOTs 217 and 218, respectively. MOTs 317 and 318 are within magnetic field-sensitive section 312. Channel section 314 provides a vacuum conduction path between ion pump 320 and magnetic field-sensitive section 312. Channel section 314 is also curved such that aperture 336 of multi-layer magnetic shield 330 is not facing or aligned with magnetic field-sensitive section 314. Thus, a portion of multi-layer magnetic shield 330 that is free of apertures is between aperture 336 and magnetic field-sensitive section 314. Thus, multi-layer magnetic shield 330 may shield MOTs 317 and 318 from the magnetic field of ion pump 320.

Multi-layer magnetic shield 330 is analogous to multi-layer magnetic shield 230 and substantially contains the magnetic field of ion pump 320. Thus, magnetic leakage from multi-layer magnetic shield 330 is small or negligible (or nonexistent) in magnetic field-sensitive region 312. Multi-layer magnetic shield 330 includes first layer 332, second layer 334, and apertures 336 and 339 that are analogous to first layer 232, second layer 234, and apertures 236 and 239. Multi-layer magnetic shield 230 (and thus layers 232 and 234) include aperture 236 that is analogous to aperture 136. Ion pump 220 and pump section 216 are physically within multi-layer magnetic shield 230, while magnetic field-sensitive section 212 is external to multi-layer magnetic shield 230. First layer 332 has a moderate relative magnetic permeability and a high saturation magnetization, for example in the ranges described in the context of first layer 132. In some embodiments, first layer 332 includes or consists of Kovar. Second layer 334 has a high relative magnetic permeability and a moderate saturation magnetization, for example in the ranges described in the context of second layer 134. In some embodiments, second layer 334 may include or consist of MuMetal.

System 300 also includes additional magnetic shield 340. Additional magnetic shield 340 may be considered to be part of multi-layer magnetic shield 330. Additional magnetic shield 340 is in channel section 314. Thus, additional magnetic shield 340 is within vacuum cell 310. Additional magnetic shield 340 may be a single layer shield (e.g. including or consisting of Kovar or MuMetal) or may be a multi-layer shield (e.g. including a layer of Kovar and a layer of MuMetal). Additional magnetic shield 340 provides an additional mechanism for directing magnetic flux within vacuum cell 310 away from magnetic field-sensitive section 312. A vacuum conduction path between ion pump 320 and sections 312 and 314 of vacuum cell 310 remains around additional magnetic shield 340.

First layer 332, second layer 334, and additional magnetic shield 340 combine to substantially contain the large magnetic field from ion pump 320. First layer 232 significantly decreases the magnitude of the magnetic field outside of first layer 332. The higher relative magnetic permeability (but lower saturation magnetization) second layer 334 may be utilized to complete shielding of ion pump 320. Additional magnetic shield 340 provides an additional reduction of magnetic field within sections 312 and 314 of vacuum cell 310.

System 300 shares the benefits of system 300. System 300 may be made compact without adversely affecting performance. Ion pump 320 may be used to evacuate vacuum cell 310 despite being in close physical proximity to magnetic field-sensitive section 312. Multi-layer magnetic shield 330 and additional magnetic shield sufficiently shield magnetic-field sensitive section 312 that operation of components such as MOTs 317 and 318 is not adversely affected. Consequently, system 300 is compact, capable of reaching sufficiently high vacuums, and highly effective for use in conjunction with quantum particles.

Figure 4:
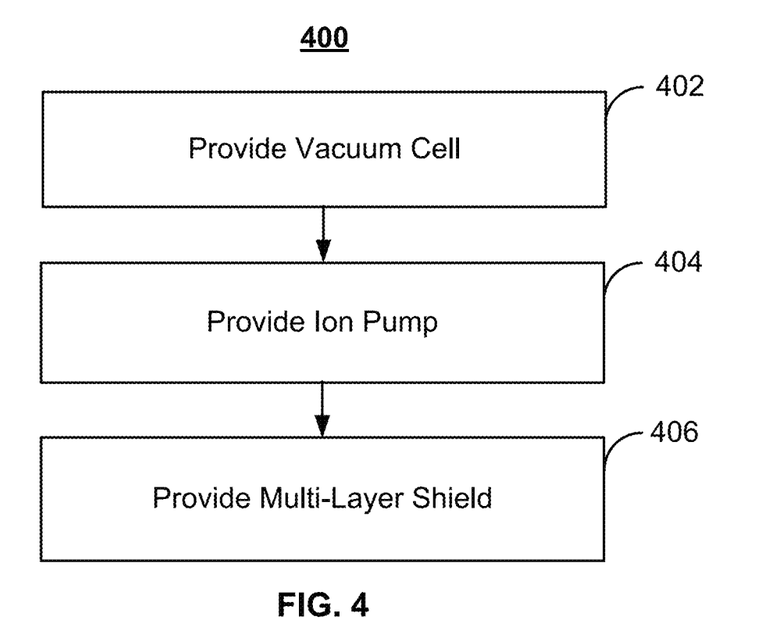
FIG. 4 is a flow chart depicting an embodiment of a method for providing a system including an ion pump and vacuum cell that is usable in connection with quantum particles.

FIG. 4 is a flow chart depicting an embodiment of method 400 for providing a system usable with quantum particles. Method 400 is described in the context of system 200. However, other systems including but not limited to systems 100 and 300 may be fabricated. For simplicity, not all steps are described and steps may include substeps. Further, processes of method 400 may be performed in another order.

A vacuum cell is provided, at 402. Thus, the desired components of the vacuum cell may be fabricated and assembled. For example, a cell body including various sections may be formed. Components may be separately fabricated and integrated. For example, portions of the MOTs and/or other apparatus may be provided. If an additional magnetic shield analogous to shield 340 is to be incorporated, such a shield may be formed and affixed to the vacuum cell.

An ion pump is provided in the pump section of the vacuum cell, at 404. Thus, permanent magnets and other portions of the ion pump may be provided, aligned with the pump section of the vacuum cell, at affixed. In some embodiments, portions of 402 and 404 may be interleaved.

The multi-layer magnetic shield is fabricated and integrated with the ion pump and vacuum cell, at 406.

For example, vacuum cell body 211 including sections 212, 214, and 216 may be formed. Components of MOTs 217 and 218 may be fabricated, aligned, and affixed in the magnetic field-sensitive section 212. Cover 213 may also be affixed to cell body 211. These processes may be performed as part of 402. Ion pump 220 is provided at 404. Thus, magnets 222 and 224 may be provided, aligned and fixed in place. Further ion pump 220 is attached to vacuum cell 210. Multi-layer magnetic shield 230 is also formed. Thus, first and second layers 232 and 234 as well as spacers 238 are formed and integrated. Multi-layer magnetic shield 230 is also attached to vacuum cell 210 such that a portion of channel section 214 is within aperture 236 of multi-layer magnetic shield 230. These processes are performed as apart of 406.

Thus, using method 400, a compact system usable with quantum particles and having improved performance may be formed. Because it includes the multi-layer magnetic shield, such a system may utilize an ion pump to achieve the desired vacuum despite the ion pump being in close physical proximity to magnetic field-sensitive section(s) of the vacuum cell. Consequently, the system may be made compact, capable of reaching sufficiently high vacuums, and highly effective for use in conjunction with quantum particles.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a vacuum cell including a magnetic field-sensitive section, a pump section, and a channel section providing a vacuum conductance path between the magnetic field-sensitive section and the pump section;
   ion pump in the pump section; and
   a multi-layer magnetic shield surrounding at least a portion of the ion pump, the multi-layer magnetic shield having a first layer and a second layer, the first layer being between the second layer and the ion pump, the first layer having a moderate relative magnetic permeability and a high saturation magnetization and the second layer having a high relative magnetic permeability and a moderate saturation magnetization.

2. The system of claim 1, wherein the moderate relative magnetic permeability has a maximum moderate relative magnetic permeability of at least one thousand and not more than twenty thousand, the high saturation magnetization is a least ten thousand Gauss, the high relative magnetic permeability has a maximum high relative magnetic permeability of at least seventy thousand at fifty Hertz, and the moderate saturation magnetization is at least four thousand Gauss and not more than nine thousand Gauss.

3. The system of claim 1, wherein first layer includes Kovar and the second layer includes MuMetal.

4. The system of claim 1, wherein the multi-layer magnetic shield includes an aperture therein, at least a portion of the channel section residing in the aperture.

5. The system of claim 4, wherein the channel section is configured such that a portion of the first layer and the second layer of the multi-layer magnetic shield is between the aperture and the magnetic field-sensitive section.

6. The system of claim 1, wherein the multi-layer magnetic shield has a characteristic width, the magnetic field-sensitive section being not more than three multiplied by the characteristic width from the ion pump.

7. The system of claim 1, wherein the channel section includes a magnetic shield therein.

8. A system, comprising:
   a vacuum cell including a magnetic field-sensitive section, a pump section, and a channel section providing a vacuum conductance path between the magnetic field-sensitive section and the pump section, the channel section including a curved region;
   ion pump in the pump section; and
   a multi-layer magnetic shield surrounding at least a portion of the ion pump, the multi-layer magnetic shield having a first layer and a second layer, the first layer being between the second layer and the ion pump, the first layer having a moderate relative magnetic permeability and a high saturation magnetization and the second layer having a high relative magnetic permeability and a moderate saturation magnetization, the moderate relative magnetic permeability having a maximum moderate relative magnetic permeability of at least two thousand and not more four thousand, the high saturation magnetization being a least ten thousand Gauss, the high relative magnetic permeability having a maximum high relative magnetic permeability of at least ninety thousand, and the moderate saturation magnetization being at least six thousand Gauss and not more than eight thousand five hundred Gauss, the multi-layer magnetic shield including an aperture therein, at least a portion of the curved region residing in the aperture, the curved region being configured such that a portion of the first layer and the second layer of the multi-layer magnetic shield is between the aperture and the magnetic field-sensitive section;

wherein the multi-layer magnetic shield has a characteristic width, the magnetic field-sensitive section being not more than two multiplied by the characteristic width from the ion pump.

9. A method, comprising:

providing a vacuum cell including a magnetic field-sensitive section, a pump section, and a channel section providing a vacuum conductance path between the magnetic field-sensitive section and the pump section;

providing ion pump in the pump section; and providing a multi-layer magnetic shield surrounding at least a portion of the ion pump, the multi-layer magnetic shield having a first layer and a second layer, the first layer being between the second layer and the ion pump, the first layer having a moderate relative magnetic permeability and a high saturation magnetization and the second layer having a high relative magnetic permeability and a moderate saturation magnetization.

10. The method of claim 9, wherein the moderate relative magnetic permeability has a maximum moderate relative magnetic permeability of at least one thousand and not more than twenty thousand, the high saturation magnetization is a least ten thousand Gauss, the high relative magnetic permeability has a maximum high relative magnetic permeability of at least seventy thousand at fifty Hertz, and the moderate saturation magnetization is at least four thousand Gauss and not more than nine thousand Gauss.

11. The method of claim 9, wherein first layer includes Kovar and the second layer includes MuMetal.

12. The method of claim 9, wherein the providing the multi-layer magnetic shield further includes:

providing an aperture in the multi-layer magnetic shield, at least a portion of the channel section residing in the aperture.

13. The method of claim 12, wherein the providing the vacuum cell further includes:

configuring the channel section such that a portion of the first layer and the second layer of the multi-layer magnetic shield is between the aperture and the magnetic field-sensitive section.

14. The method of claim 9, wherein the multi-layer magnetic shield has a characteristic width, the magnetic field-sensitive section being not more than three multiplied by the characteristic width from the ion pump.

* * * * *